United States Patent (10) Patent No.: US 7,113,442 B2
Kurihara (45) Date of Patent: Sep. 26, 2006

(54) NON-VOLATILE SEMICONDUCTOR MEMORY, SEMICONDUCTOR DEVICE AND CHARGE PUMP CIRCUIT (75) Inventor: Kazuhiro Kurihara, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 82 days.

(21) Appl. No.: 11/126,701

(22) Filed: May 11, 2005

(65) Prior Publication Data

US 2005/0254313 A1 Nov. 17, 2005

Related U.S. Application Data (63) Continuation of application No. PCT/JP2004/006262, filed on May 11, 2004.

(51) Int. Cl.
*G11C 7/00* (2006.01)

(52) U.S. Cl. ............ 365/226; 365/185.18; 365/189.11; 327/536

(58) Field of Classification Search ........ 365/226, 365/185.18, 189.11; 327/526, 538
See application file for complete search history.

(56) References Cited

U.S. PATENT DOCUMENTS

| 5,280,420 A | | 1/1994 | Rapp .......................... 363/60 |
| 5,677,874 A | | 10/1997 | Yamano ................ 365/185.18 |
| 5,812,017 A | * | 9/1998 | Golla et al. ................. 327/536 |
| 6,473,321 B1 | * | 10/2002 | Kishimoto et al. ........... 363/59 |
| 6,735,119 B1 | * | 5/2004 | Mihara .................. 365/185.18 |
| 6,788,577 B1 | * | 9/2004 | Mihara .................. 365/185.18 |
| 2002/0001207 A1 | | 1/2002 | Kishimoto et al. ........... 363/59 |

FOREIGN PATENT DOCUMENTS

| JP | 6-208798 | 7/1994 |
| JP | 8-297986 | 11/1996 |
| JP | 2002-26254 A | 1/2002 |

* cited by examiner

Primary Examiner—Son T. Dinh (57) ABSTRACT

A non-volatile semiconductor memory includes a first pump starting to operate at a first timing and producing a first voltage, a second pump starting to operate at a second timing following the first timing and driving a given node at a second voltage, the given node being connected to a non-volatile semiconductor memory cell, and a booster boosting the given node using the first voltage at the second timing.

14 Claims, 12 Drawing Sheets

NON-VOLATILE SEMICONDUCTOR MEMORY, SEMICONDUCTOR DEVICE AND CHARGE PUMP CIRCUIT

CROSS REFERENCE TO RELATED APPLICATIONS

This is a continuation of International Application No. PCT/JP2004/006262, filed May 11, 2004.

BACKGROUND OF THE INVENTION

1. Field of the Invention

The present invention relates to a non-volatile semiconductor memory and a semiconductor device, and more particularly, to a circuit technique for boosting a power supply voltage.

2. Description of the Related Art

In a flash memory that is one of the non-volatile semiconductor memories, a power supply voltage is boosted to internally generate voltages for programming and erasing. For example, in program verification, a power supply voltage (for example, 3 V) is boosted to generate a high voltage (for example, 6 V), which is applied to the gate of a non-volatile semiconductor memory cell (word line) and the gate of a gate transistor for selecting the non-volatile semiconductor memory cell. In programming following the program verification, the power supply voltage is boosted to generate a higher voltage (for example, 9 V), which is applied to the gates of the memory cell and the gate transistor. The program verification is a read operation for verifying that the memory cell has a given threshold voltage. If the verification fails (the memory cell does not have the given threshold voltage), the cell is further programmed to raise the threshold voltage. In this manner, the program verification and programming are repeatedly carried out in turn until the memory cell has the given threshold voltage.

A charge pump circuit implements the boosting. The above-mentioned example employs a charge pump circuit that generates a voltage of 6 V from the power supply voltage, and another charge pump circuit that generates a voltage of 9 V from the power supply voltage. If the charge pump circuit operates slowly (low drivability), it will take a long time to complete programming and erasing. The boosting speed can be improved by increasing the size of a capacitor, whereas this needs a large circuit area and a large power is consumed. Generally, the most importance is attached to the circuit area, and the boosting speed is sacrificed to a certain extent.

SUMMARY OF THE INVENTION

The object of the present invention is to provide a non-volatile semiconductor memory, a semiconductor device, a charge pump circuit and a method of controlling the potential of a node.

The present invention is a non-volatile semiconductor memory comprising: a first pump starting to operate at a first timing and producing a first voltage; a second pump starting to operate at a second timing following the first timing and driving a given node at a second voltage, the given node being connected to a non-volatile semiconductor memory cell; and a booster boosting the given node using the first voltage at the second timing.

The non-volatile semiconductor memory may be configured so that a period from the first timing to the second timing is provided for program verification, and another period starting from the second timing is provided for programming.

The non-volatile semiconductor memory may be configured so that the booster comprises: a capacitor; a first circuit that allows the first voltage to be applied to the given node during a period from the first timing to the second timing; and a second circuit applying a voltage based on the first voltage to the given node during only a predetermined period starting from the second timing.

The non-volatile semiconductor memory may be configured so that the capacitor is also used for generating a read voltage applied to the gate of the non-volatile semiconductor memory at the time of reading data.

The non-volatile semiconductor memory may be configured so that the second pump comprises a plurality of boost stages, and nodes between adjacent boost stages among the plurality of boost stages are precharged by the first voltage during a period from the first timing to the second timing.

The non-volatile semiconductor memory may be configured so that the second pump circuit comprises transistors which apply the first voltage to the nodes in response to a signal indicating the period from the first timing to the second timing.

The non-volatile semiconductor memory may be configured so that the first voltage is applied to a bit line to which the non-volatile semiconductor memory is connected at the time of programming.

The present invention is a charge pump circuit comprising: a first pump starting to operate at a first timing and producing a first voltage; and a second pump starting to operate at a second timing following the first timing and driving a given node at a second voltage, the second pump including a plurality of boost stages, wherein nodes between adjacent boost stages among the plurality of boost stages are precharged by the first voltage during a period from the first timing to the second timing.

The charge pump circuit may be configured so that the second pump circuit comprises transistors which apply the first voltage to the nodes in response to a signal indicating the period from the first timing to the second timing.

The present invention is a semiconductor device comprising: a non-volatile semiconductor memory cell; a first pump starting to operate at a first timing and producing a first voltage; and a second pump starting to operate at a second timing following the first timing and driving a given node at a second voltage, the given node being connected to the non-volatile semiconductor memory cell, the second pump including a plurality of boost stages, wherein nodes between adjacent boost stages among the plurality of boost stages are precharged by the first voltage during a period from the first timing to the second timing.

The semiconductor device may be configured so that the second charge pump includes a transistor that applies the first voltage to the given node in response to a signal indicating a period from the first timing to the second timing.

The semiconductor device may be configured so that the first voltage is applied to a bit line to which the non-volatile semiconductor memory is connected at the time of programming.

The present invention is a method comprising the steps of: starting up an operation of a first pump at a first timing to produce a first voltage; starting up an operation of a second pump at a second timing following the first timing to drive a given node at a second voltage, the given node being connected to a non-volatile semiconductor memory cell; and boosting the given node using the first voltage at the second timing.

The present invention is a method comprising the steps of: starting up an operation of a first pump at a first timing to produce a first voltage; starting up an operation of a second pump at a second timing following the first timing to drive a given node at a second voltage, the given node being connected to a non-volatile semiconductor memory cell; and precharging nodes between adjacent boost stages among a plurality of boost stages of the second pump by the first voltage during a period from the first timing to the second timing.

According to the present invention, when the given node is boosted to the second voltage by the second pump, the given node is boosted using the first pump, so that high-speed operation can be realized. In addition, high-speed operation is further improved by precharging the nodes within the second pump by using the output voltage of the first pump.

BRIEF DESCRIPTION OF THE DRAWINGS

Preferred embodiments of the present invention will be described in detail based on the following figures wherein.

DESCRIPTION OF THE PREFERRED EMBODIMENTS

First, a description will be given, with reference to FIG. 1, of a conventional boost circuit employed in a flash memory that is one of the non-volatile semiconductor memories.

Figure 1:
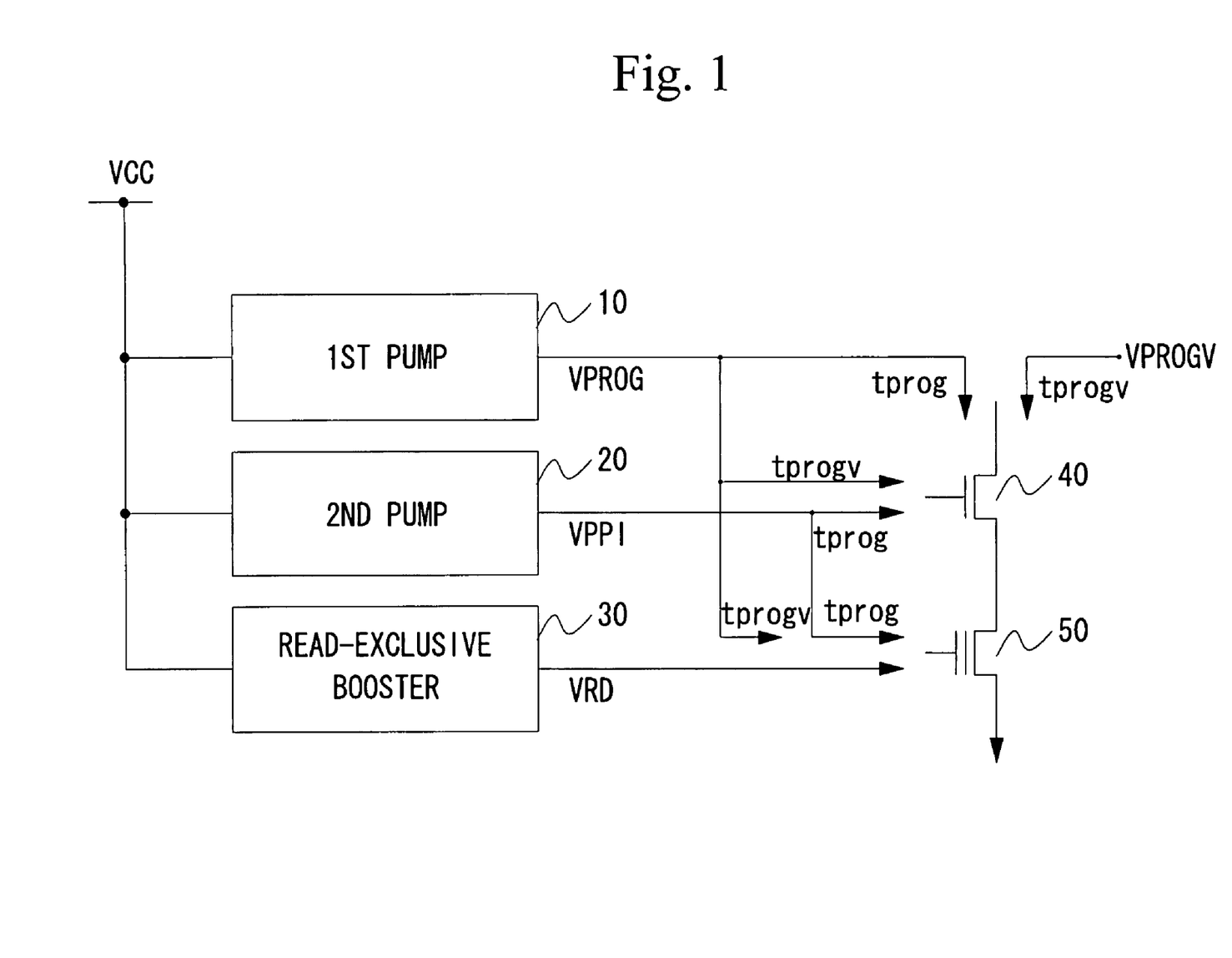
FIG. 1 is a diagram of a conventional structure of a boost circuit employed in a flash memory that is one of the non-volatile semiconductor memories.

FIG. 1 shows a memory cell 50, and a gate transistor 40 for selecting a bit line to which the memory cell 50 is connected. There are provided, as boost circuits, a first pump 10, a second pump 20 and a read-exclusive booster 30. At the time of verification in programming and erasing, a program verify voltage VPROGFV (for example, 1 V) is applied to the bit line, and the first pump 10 keeps the gate voltages of the gate transistor 40 and the memory cell 50 at a voltage VPROG (for example, 6V). In programming (tprog) that follows the verify operation, the voltage VPROG generated by the first pump 10 is applied to the bit line, and the second pump 20 maintains the gates of the gate transistor 40 and the memory cell 50 at VPPI (for example, 9 V). The first pump 10 boosts a power supply voltage VCC (for example, 3 V) to the voltage VPROG, and the second pump 20 boosts the power supply voltage VCC to the voltage VPPI. The read-exclusive booster 30 applies a read voltage VRD (for example, 4 V) to the gate of the memory cell 50 when data is read from the memory cell 50. The read-exclusive booster 30 includes capacitors, which are boosted at the time of reading.

The second pump 20 has a disadvantage in that it takes a long time to boost the power supply voltage VCC of 3 V to 9 V (=VPPI). Thus, the gate voltages of the gate transistor 40 and the memory cell 50 do not reach 9 V for a while after the verification is finished, so that the memory cell 50 cannot be programmed rapidly. The present invention can overcome the above-mentioned problem. Two embodiments of the present invention will now be described.

First Embodiment

Figure 2:
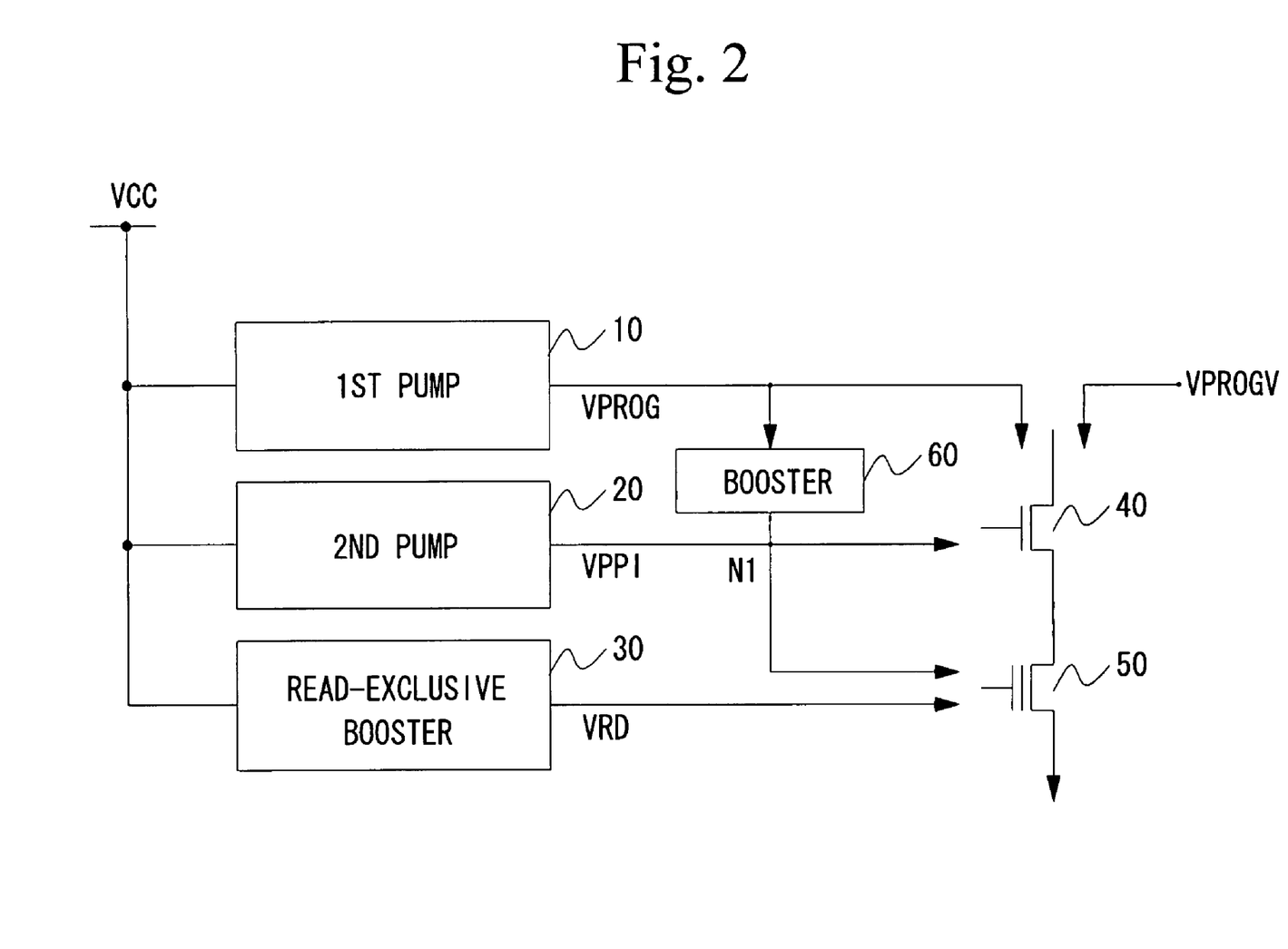
FIG. 2 is a diagram of a non-volatile semiconductor memory according to a first embodiment of the present invention.

FIG. 2 is a diagram of a non-volatile semiconductor memory according to a first embodiment of the present invention in which the same reference numerals as those in FIG. 1 refer to the same elements. A boost circuit used in the first embodiment has a circuit configuration obtained by adding a booster 60 to the circuitry shown in FIG. 1. That is, the first embodiment is a flash memory equipped with the first pump that starts operating at a first timing and generates the first voltage VPROG, the second pump that starts operating at a second timing following the first timing and applies the second voltage VPPI to a node N1 connected to the gate of the memory cell 50 and the gate of the gate transistor 40, and the booster 60 that boosts the node N1 using the first voltage VPROG at the first timing.

In the program verification that starts at the first timing, a program verify voltage VRPOGV (for example, 1 V) is applied to the bit line, and the first pump 10 maintains the gates of the gate transistor 40 and the memory cell 50 at the first voltage, that is, the voltage VPROG (for example, 6 V) through the booster 60. That is, the potential of the node N1 at the time of verification is maintained at VPROG (=6 V). After that, at the time of programming that starts at the second timing, the booster 60 boosts the node N1 using the voltage VPROG. The second pump 20 that starts to boost at the second timing starts the boost operation from the power supply voltage VCC. At this time, the node N1 is already boosted to the voltage VPROG. Thus, the potential of the node N1 starts to be raised from VPROG that is higher than the power supply voltage VCC due to the function of the second pump 20, and reaches the voltage VPPI (for example, 9 V) quickly. After the potential of the node N1 reaches VPPI, only the second pump 20 maintains the potential of the node N1 at VPPI.

In this manner, the gates of the memory cell 50 and the gate transistor 40 can be supplied with the boosted voltage VPPI quickly without enlarging the circuit scale of the second pump 20. Thus, the flash memory can operate at a higher speed without any enlargement of the circuit scale.

Figure 3:
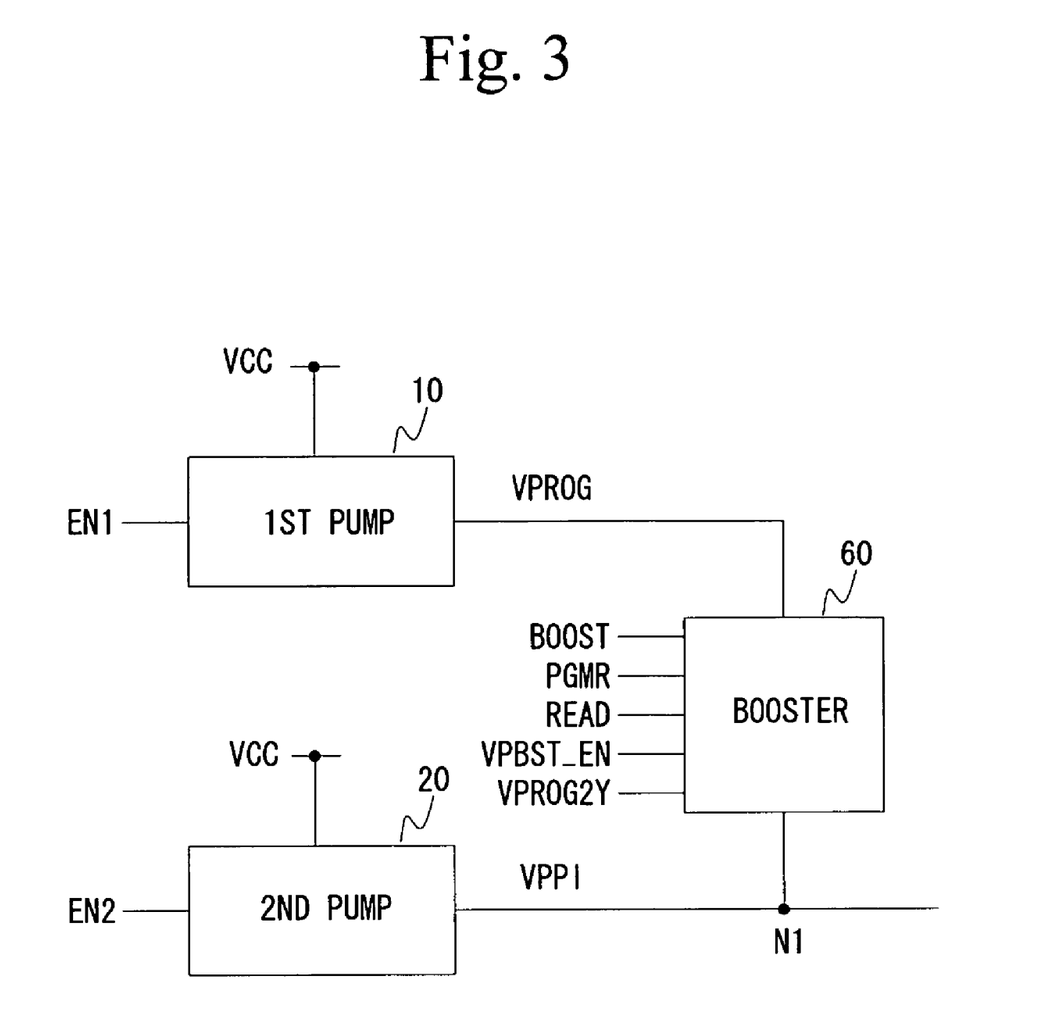
FIG. 3 is a diagram showing control signals applied to the booster shown in FIG. 2.

The capacitors for boosting provided in the booster 60 (not shown in FIG. 3) may be provided separate from those of the read-exclusive booster 30, as shown in FIG. 3, or may be shared therewith, as will be described later.

FIG. 3 shows control signals supplied to the booster 60. The booster 60 shown in FIG. 3 has the read-exclusive booster 20 shown in FIG. 2 that is built therein. That is, the capacitor for boosting is shared. A control signal READ indicates a read period during which data is read from the memory cell. A control signal BOOST indicates a period for boosting the word line at the time of reading. A control signal VPROG2Y is ON (high level) during the period for the program verification. A control signal PGMR is ON (high level) during a given period at the commencement of programming. A control signal VPBST_EN indicates a period during which the node N1 is boosted by the booster 60. A signal EN1 is used to set the first pump 10 to the enabled state. A control signal EN2 is used to set the second pump 20 to the enabled state. These control signals are supplied from a control circuit 120 shown in FIG. 12, which will be described later.

Figure 4:
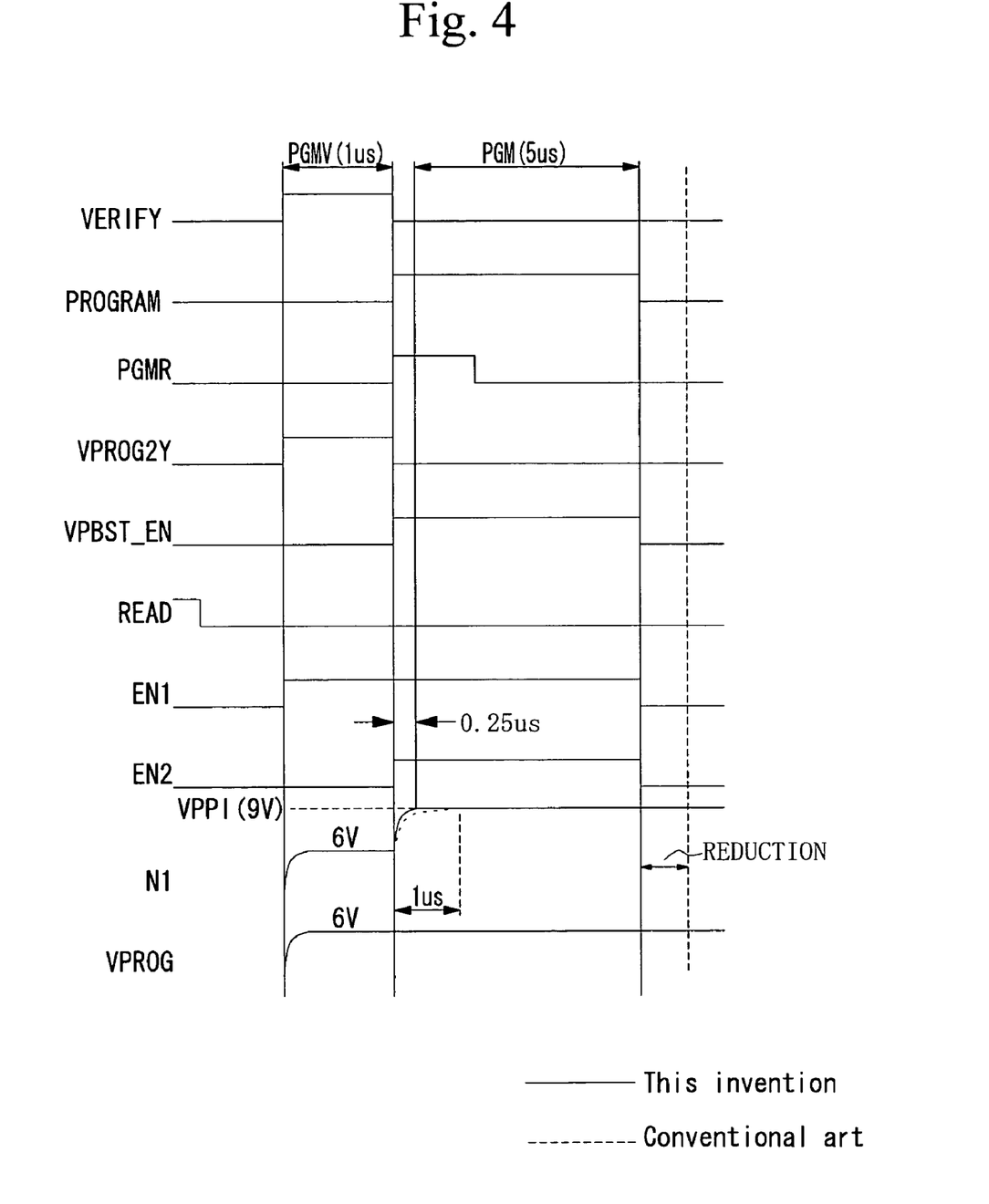
FIG. 4 is a timing chart of the booster shown in FIG. 3 at the time of verification and programming.
Figure 5:
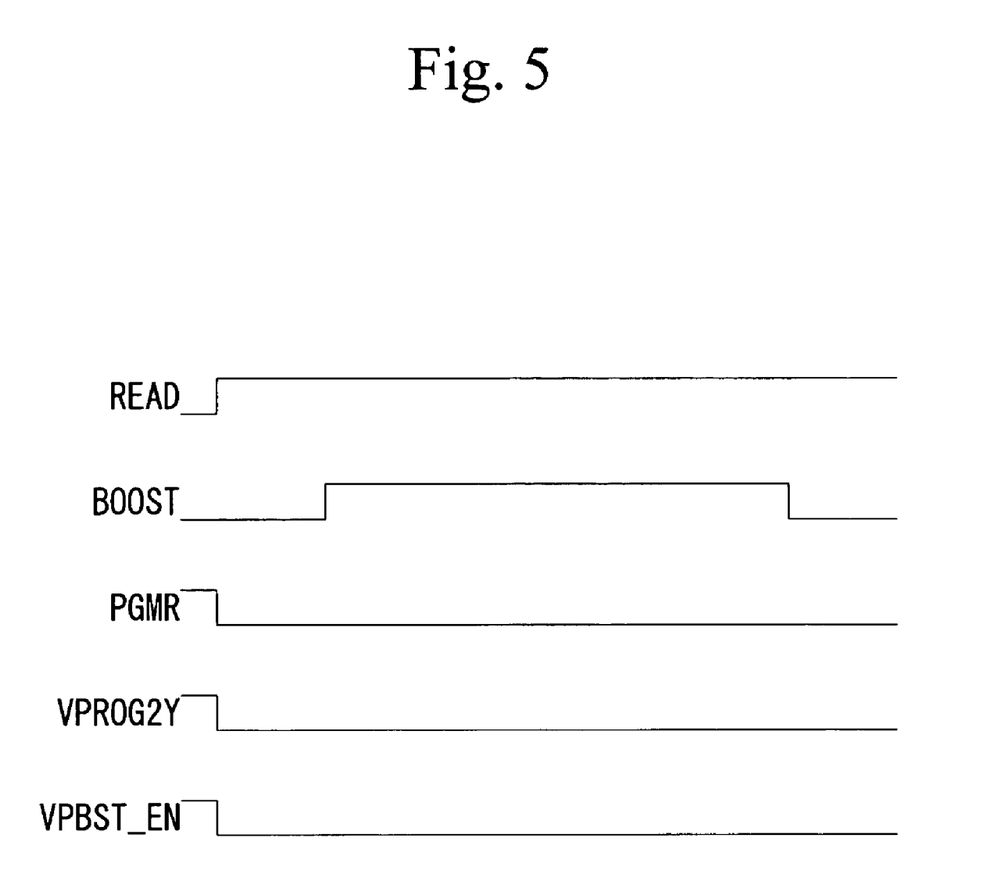
FIG. 5 is a timing chart of an operation of the booster shown in FIG. 3 at the time of reading.

FIG. 4 shows changes of the above-mentioned control signals at the time of verification and programming, and FIG. 5 shows changes of the control signals at the time of reading. First, FIG. 4 will be described. Referring to FIG. 4, the verification period is denoted as PGMV (for example, 1 μs), and the programming period is denoted as PGM (for example, 5 μs). The start timing of the verification period is defined as the first timing, and the start timing of the programming period is defined as the second timing. The enable signal EN1 is at the high level during the verification period PGMV and the programming period PGM, and the enable signal is at the high level during the programming period PGM. That is, the first pump 10 operates during the verification period PGMV and the programming period PGM, and the second pump 20 operates during the programming period PGM. When the control signal VPROG2Y changes from the low level to the high level and the verification period PGMV starts, the enable signal EN switches to the high level and the first pump 10 starts to operate. During the time when the control signal VPROG2Y is at the high level, the booster 60 connects the output path of the first pump 10 to the node N1. Thus, the node N1 is set at the potential VPROG. When the verification period PGMV ends and the programming period PGM starts, the enable signal EN2 changes to the high level, the control signal VPBST_EN to the high level and the control signal PGMR to the high level. During the time when the control signal PGMR is at the high level, the booster 60 boosts the node N1 by using the voltage VPROG output by the first pump 10. In this state, the second pump 20 charges the node N1, so that the potential of the node N1 is raised to VPPI (9 V) from VPROG (6 V) quickly, as shown in FIG. 4. When the control signal PGMR changes from the high level to the low level, the booster 60 disconnects the first pump 10 from the node N1. Thus, the second pump 20 takes over the boosting by the booster 60, and maintains the node N1 at the potential VPPI. The read signal READ is at the low level during the verification period PGMV and the programming period PGM.

A waveform shown by the broken line shows the conventional operation. The voltage VPROG is generated by the first pump 10 during the period PGMV for the program verification. As has been described previously, the potential of the node N1 is raised to VPPI by only the second pump 20 during the programming period PGM. Thus, it takes a certain time for the node N1 to reach the potential VPPI. According to the experimental results obtained by the inventors, it takes 1 μs to raise the node N1 to VPPI in the conventional operation, while it takes only 0.25 μs in the present embodiment. Thus, the time necessary to raise the node N1 to VPPI can be shortened to ¼ by the present embodiment. It is thus possible to reduce the programming period and operate the flash memory at a higher speed.

FIG. 5 is the timing chart of the read operation. While the control signal BOOST is at the high level, the booster 60 boosts the word line, that is, the gate of the memory cell 50 to the given voltage (for example, 4 V). During the read period, the control signals PGMR, VPROG2Y and BPBST_EN are maintained at the low level.

Figure 6:
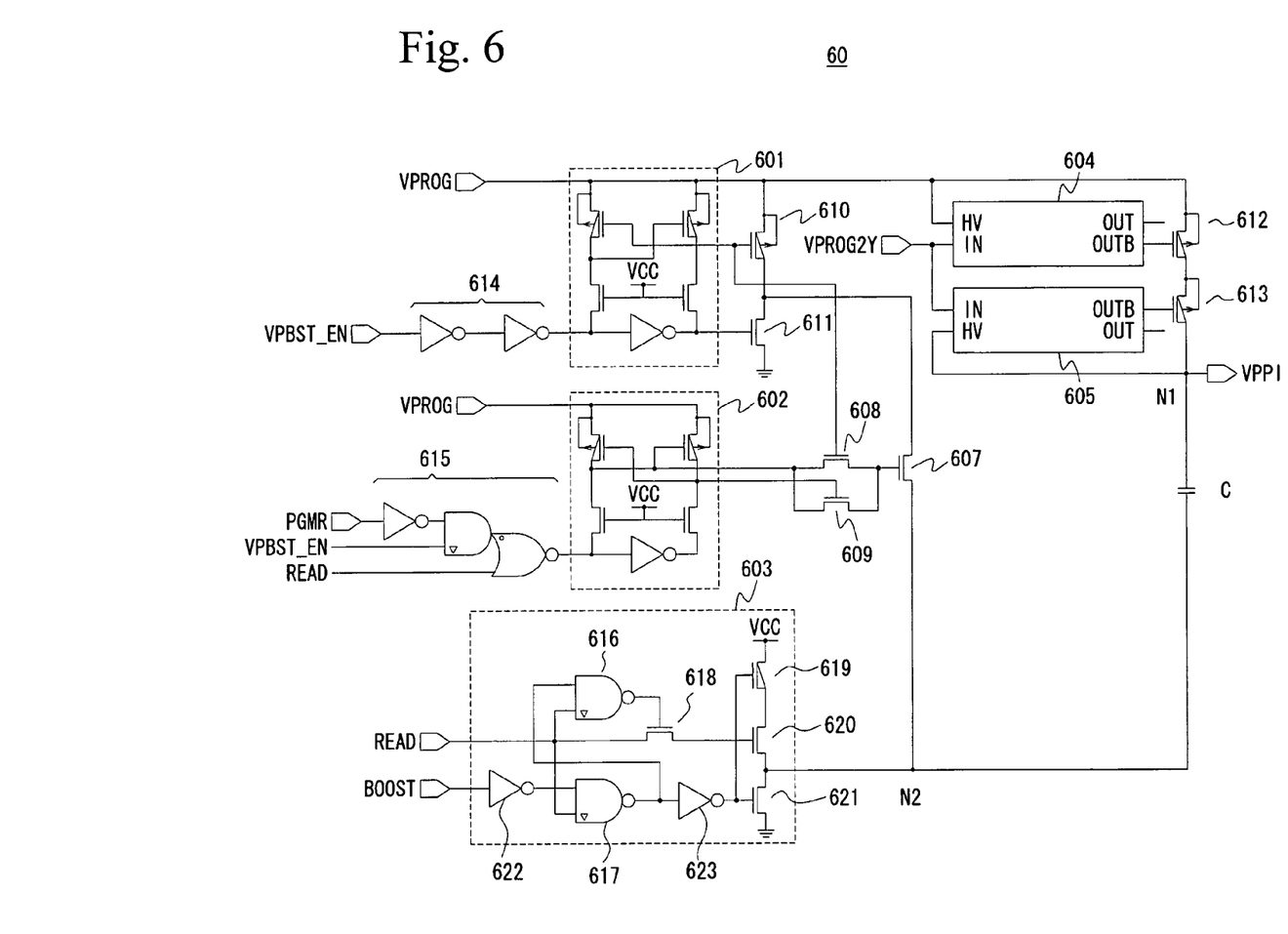
FIG. 6 is a circuit diagram of a configuration of the booster shown in FIG. 3.
Figure 7:
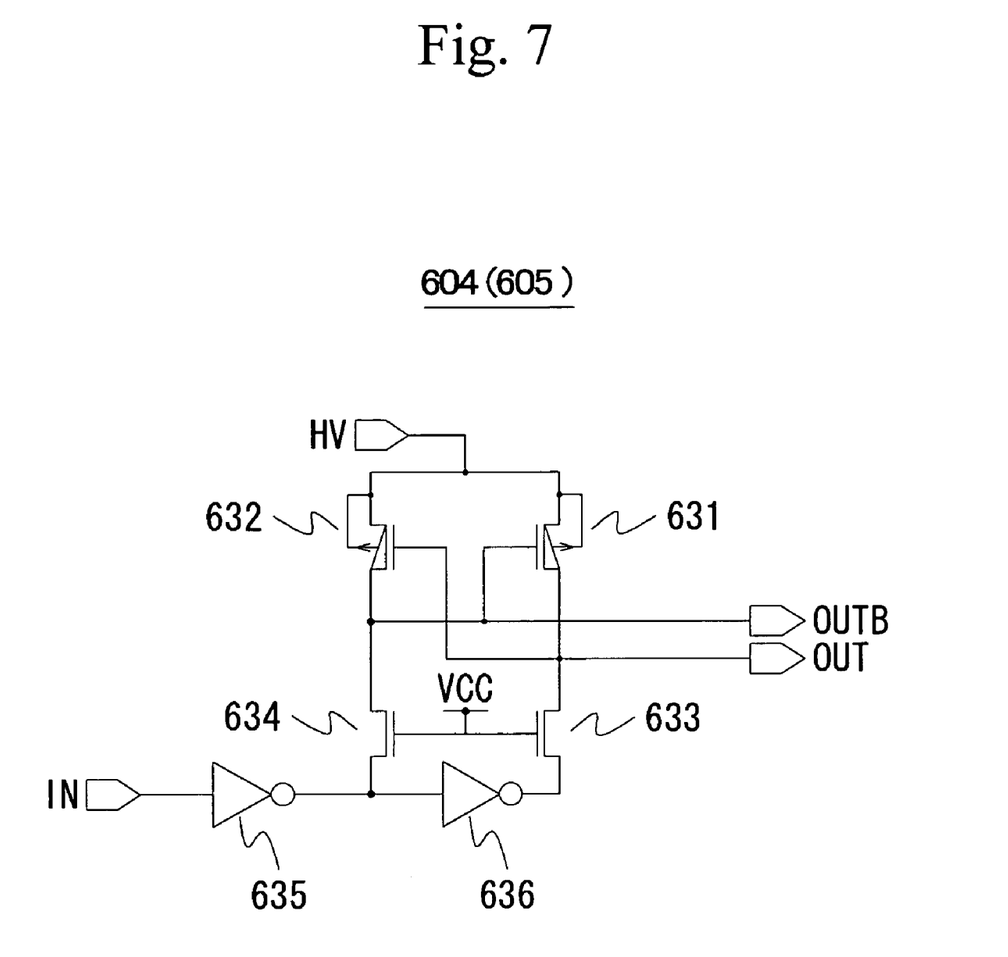
FIG. 7 is a circuit diagram of a configuration of a level shifter shown in FIG. 6.

FIG. 6 is a circuit diagram of a configuration of the booster 60. The booster 60 has level shift circuits 601, 602, 604 and 605, a read control circuit 603, and a capacitor C for boosting. Further, the booster 60 includes N-channel transistors 607, 608, 609 and 611, a P-channel transistor 610, an inverter 614, and a logic circuit 615. The read circuit 603 has NAND gates 616 and 617, inverters 622 and 623, N-channel transistors 618, 620 and 621, and a P-channel transistor 619. FIG. 7 shows a circuit configuration of each of the level shifters 604 and 605. Each of the level shifters 604 and 605 has P-channel transistors 631 and 632, N-channel transistors 633 and 634, and inverters 635 and 636. The level shifters 604 and 605 convert the amplitude between the reference potential VSS (for example, ground potential) and the power supply voltage VCC available at an input IN to another amplitude between VSS and VPROG. The level shifters 601 and 602 shown in FIG. 6 have the same configuration as mentioned above. The logic circuit 615 is made up of an inverter, an AND gate and a NOR gate.

A description will now be given of the operation of the booster 60. First, the verification operation and programming operation will be described. The verification is initiated when the control signal VPROG2Y changes from the low level to the high level. In response to the rising edge of the control signal VPROG2Y, the level shifters 604 and 605 change their outputs OUTB from the low level to the high level, so that the transistors 612 and 613 are turned ON. Thus, the node N1 is supplied with the voltage VPROG that is output by the first pump 10. A path that includes the transistors 612 and 613 (this path is defined as a first circuit) connects the first pump 10 and the node N1. The read signal READ is maintained at the low level, and the transistors 621 and 620 of the read control circuit 603 are thus OFF and ON, respectively. Since the control signal VPBST_EN is maintained at the low level, the transistor 611 is ON. The outputs of the level shifters 601 and 602 to the level shifter 608 are both OFF, and the gate potential of the transistor 607 is thus equal to VPROG-Vth where Vth is the threshold voltage of the transistor 607. Thus, the transistor 607 is turned ON, a node N2 connected to one end of the capacitor C is defined at VSS via the transistor 611. Since the first pump 10 has a drivability higher than the second pump 20, the potential of the node N1 is raised to VPROG quickly.

When the mode shifts to the programming period from the verification period, the control signal VPROG2Y falls to the low level from the high level, and the transistors 612 and 613 are turned OFF. The control signal VPBST_EN is raised to the high level from the low level, and is applied to the level shifter 601 via a group 614 of inverters. The level shifter 601 turns ON the transistor 610 and turns OFF the transistors 611 and 608. The logic circuit 615 outputs the high level to the level shifter 602 to provide continuity with the verification period as long as the control signal PGMR has been raised to the high level from the low level. Thus, the transistor 609 is OFF. Thus, the voltage VPROG from the first pump 10 is applied to the transistor 607, and the gate voltage thereof is boosted to a potential higher than the voltage VPROG due to the boot strap function. Thus, the transistor 607 is turned ON. This applies the voltage VPROG to the node N2 connected to the end of the capacitor C via the transistors 610 and 607. In this manner, the capacitor C is boosted by the first pump 10. That is, the end of the capacitor C1 (node N1) is boosted quickly when the mode enters into the programming because the other end of the capacitor C2 (node N2) is supplied with the voltage VPROG. At that time, the node N1 is also boosted by the second pump 20. A circuit that includes the transistors 610 and 607 and the level shifter 602 related to the above-mentioned boosting is defined as a second circuit.

When the control signal PGMR falls to the high level from the low level, the logic circuit 615 changes its output from the high level to the low level. Thus, the logic circuit 615 turns OFF the transistor 607, and the node N2 is brought into a floating state. Therefore, the capacitor C is not operatively seen (isolated) from the second pump 20, and is not the load of the second pump 20. Thus, the voltage VPPI can be retained.

The read operation shown in FIG. 5 will now be described. The read signal READ changes from the low level to the high level, and the booster 60 starts to generate a boosted voltage necessary for the read operation. When the read signal changes to the high level, the transistors 620 and 621 of the read circuit 603 are turned ON and the transistor 619 is turned OFF, the node N2 being set at the ground potential VSS. At that time, the transistor 607 is OFF. Next, the control signal BOOST rises to the high level from the low level, and the transistor 621 is turned OFF and the transistors 619 and 620 are turned ON. Thus, the read circuit 603 sets the node N2 to the power supply voltage VCC and boosts the capacitor C. When the read signal falls to the low level, the read circuit 603 is disabled.

Figure 8:
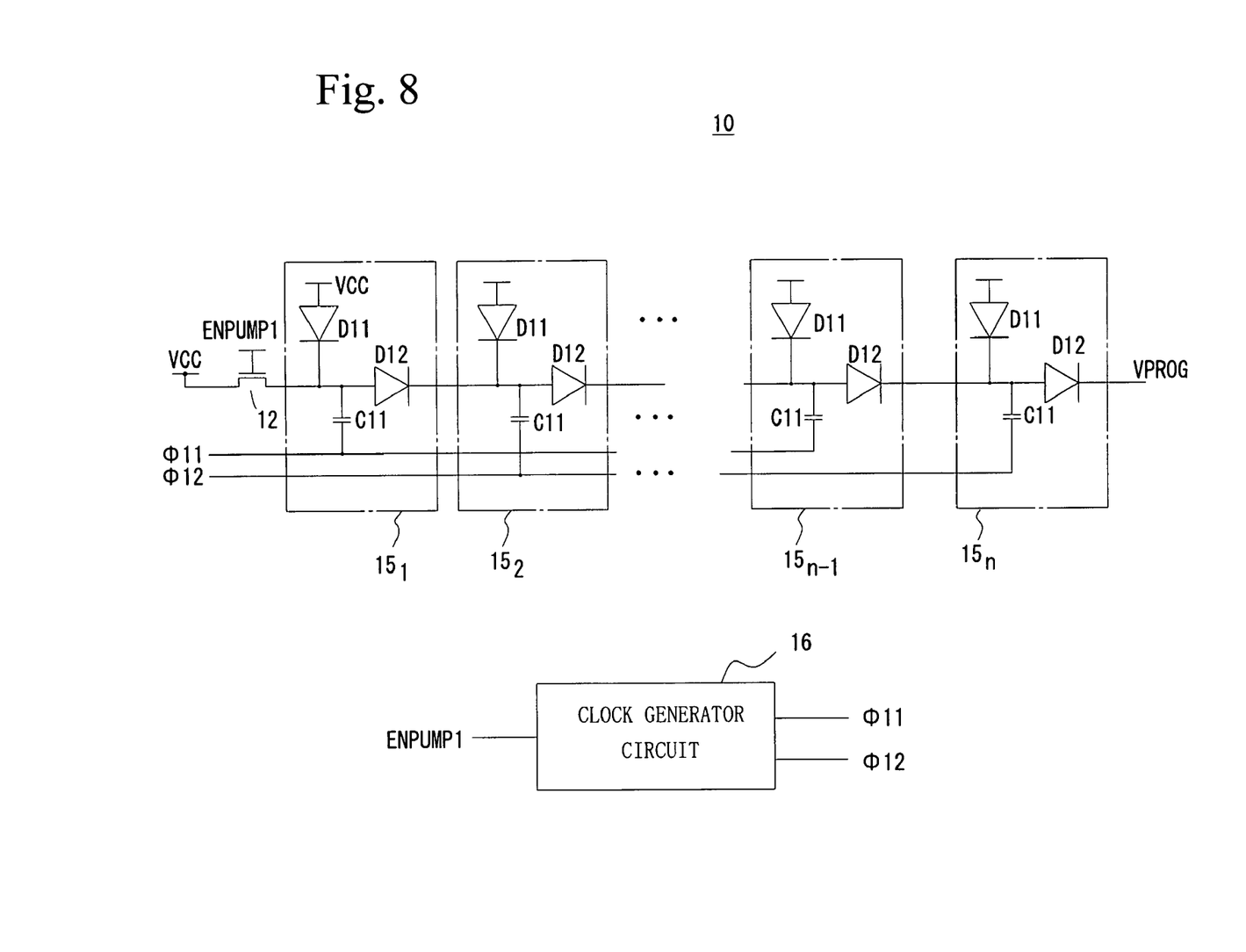
FIG. 8 is a circuit diagram of a configuration of a first pump shown in FIG. 3.

FIG. 8 shows a configuration of the first pump 10, which includes a transistor 12, and a plurality of boost stages $15_1$–$15_n$. The transistor 12 is turned ON when an enable signal ENPUMP1 changes to the high level. Each boost stage is made up of two diodes D11 and D12 and a single capacitor C11. The diodes D11 and D12 may be diode-connected transistors. One end of the capacitor C11 is precharged to VCC-Vth via the diode D11 where Vth is the forward drop voltage of the diode. The other end of the capacitor C11 is supplied with either a pulse $\Phi 11$ or $\Phi 12$. When the signal ENPUMP1 becomes active, a clock generator circuit 16 operates, and generates the complementary pulses $\Phi 11$ and $\Phi 12$. Thus, the pump circuit starts the boost operation. When the pulse $\Phi 11$ rises to the high level (for example, 3 V), the capacitor C11 is boosted, and the charge stored therein is transferred to and stored in the capacitor C11 of the next stage via the associated diode D12. Next, the pulse $\Phi 11$ falls to the low level and the pulse $\Phi 12$ simultaneously rises to the high level. At that time, the charge stored in the capacitor C11 of the above next stage is transferred to and stored in the capacitor C11 of the stage following the above next stage via the associated diode D12. The above operation is repeatedly carried out so that the output voltage gradually rises, and finally becomes equal to the boosted voltage VPROG. The voltage VPROG may be regulated so as not to exceed a given voltage (for example, 6 V) by a regulation circuit, which is not shown. The second pump 20 has the same configuration as the first pump 10. As will be described later, it is preferable to employ a configuration of the second pump 20 capable of operating more quickly.

As described above, the first embodiment is capable of quickly raising the gates of the memory cell 50 and the gate transistor 40 to a given level without any increase in the circuit scale. This enables faster programming in the flash memory.

Second Embodiment

Figure 9:
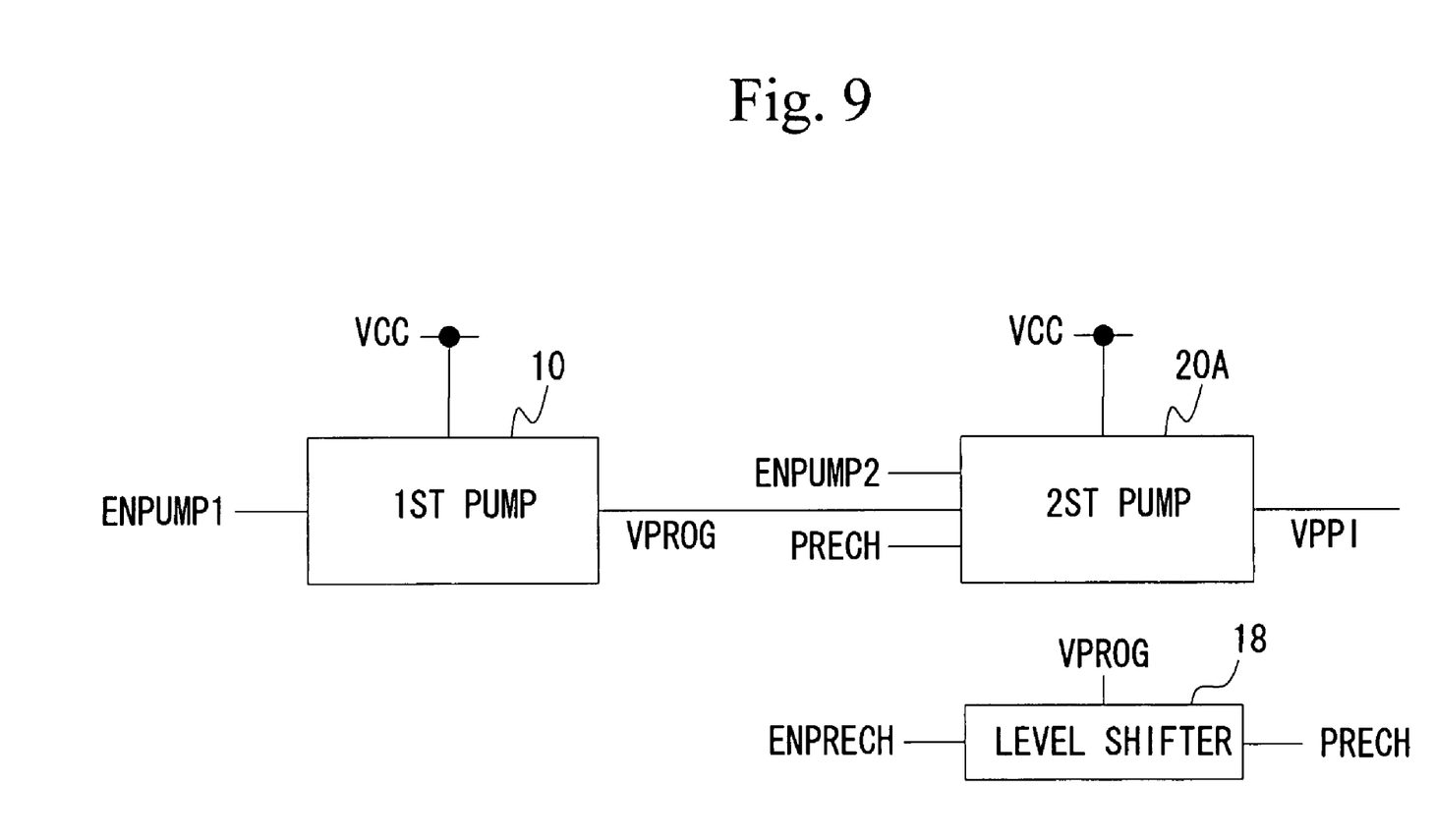
FIG. 9 is a diagram of a configuration of a booster circuit employed in a non-volatile semiconductor memory according to a second embodiment of the present invention.
Figure 10:
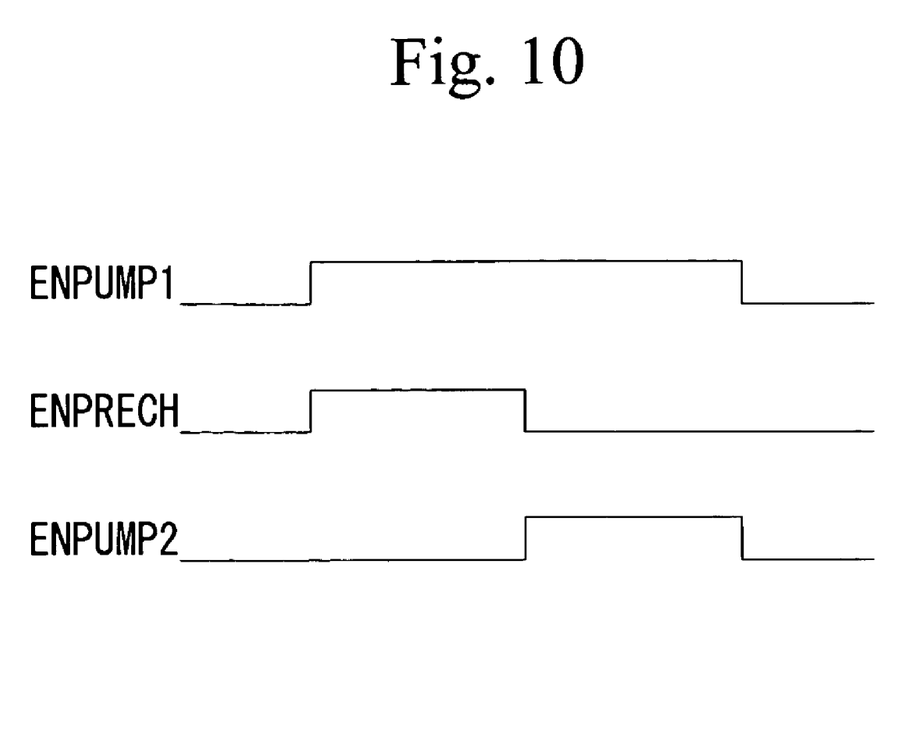
FIG. 10 is a timing chart of the configuration shown in FIG. 9.

FIG. 9 shows a configuration of a boost circuit of a flash memory according to a second embodiment of the present invention. FIG. 10 is a timing chart of control signals shown in FIG. 9. As shown in these figures, the flash memory of the second embodiment has the first pump 10 and a second pump 20A. The first pump 10 starts the boost operation in response to the enable signal ENPUMP1 and generates the voltage VPROG by boosting the power supply voltage VCC. The second pump 20A starts the boost operation in response to an enable signal ENPUMP2, and generates the voltage VPPI (>VPROG) by boosting the power supply voltage. The second pump 20A receives a precharge enable signal PRECH that rises at the same time as the enable signal ENPUMP1. During the time when the precharge enable signal ENPRECH is at the high level, each node between adjacent boost stages is precharged to the voltage VPROG generated by the first pump 10.

Figure 11:
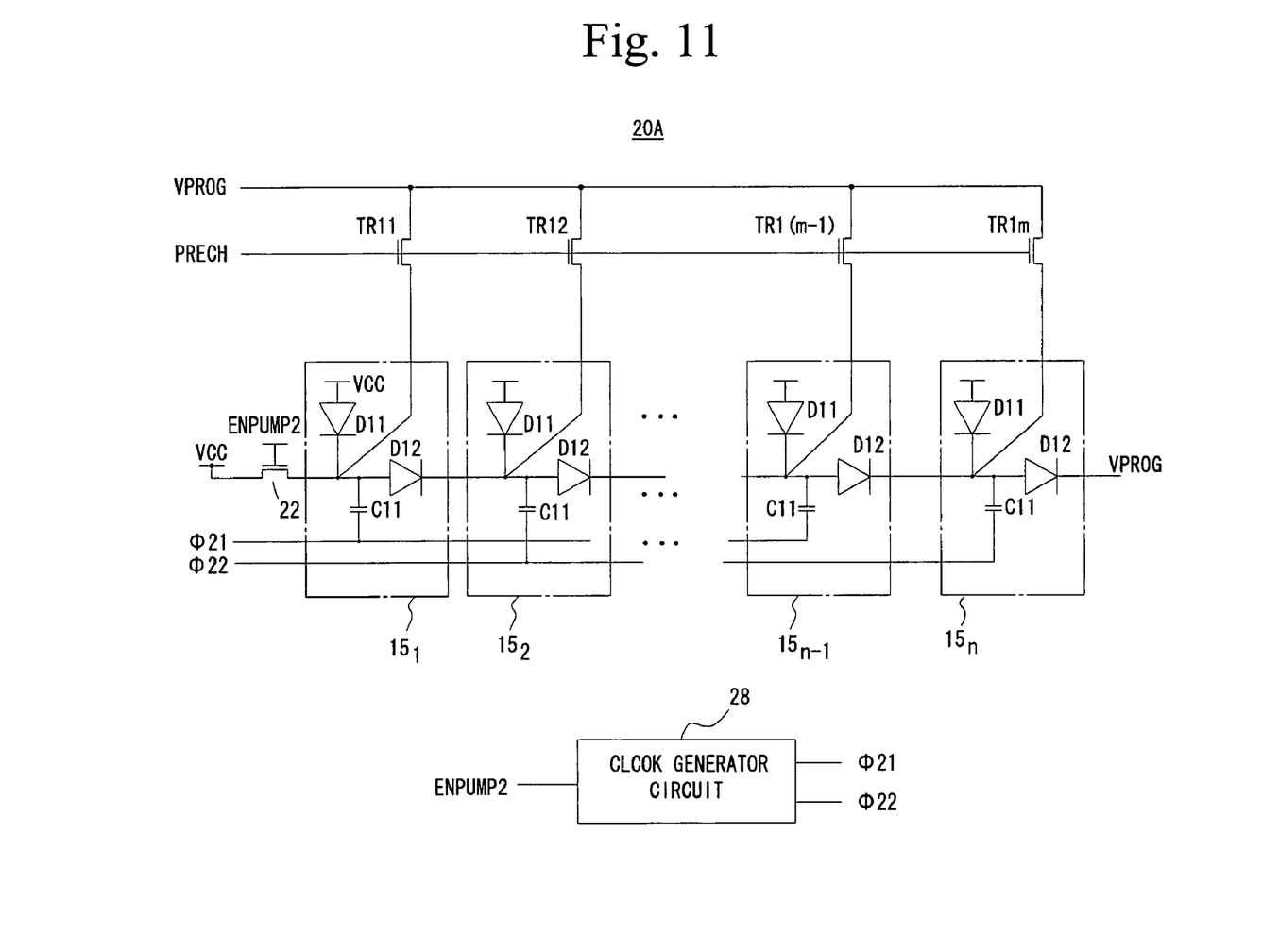
FIG. 11 is a circuit diagram of a configuration of a second pump shown in FIG. 9.

FIG. 11 is a circuit diagram of he second pump 20A. As in the case of the first pump 10 shown in FIG. 8, the second pump 20A has a transistor 22, and a plurality of boost stages $25_1$–$25_n$. Each boost stage is supplied with clocks $\Phi 21$ and $\Phi 22$ generated by a clock generator circuit 28. The transistor T22 is turned ON when the boost signal ENPUMP2 switches to the high level. The boost stages $25_1$–$25_n$ have the same circuit configuration as the boost stages $25_1$–$25_n$. The nodes via which the adjacent boost stages are connected are connected to the sources of transistors TR11–TR1m. For example, the source of the transistor TR11 is connected to the node via which the boost stages $25_1$ and $25_2$ are connected. The drains of the transistors TR11–TR1m are supplied with the voltage output by the first pump 10, and the gates thereof are supplied with the precharge signal PRECH. The precharge signal PRECH is the voltage VPROG via a level shifter 18 during the time when a precharge enable signal ENPRECH is at the high level. The transistors TR11–TR1m apply the voltage VPROG to the nodes between the boost stages and precharges these nodes to VPROG higher than VCC. Thereafter, the enable signal ENPUMP2 rises and the second pump 20A starts the charge pump operation. Since the nodes between the boost stages have been precharged to the voltage VPROG, the second pump 20A can raises the output node to VPPI quickly.

The circuit configuration shown in FIG. 11 may be applied to the second pump 20 employed in the first embodiment. Thus, the second pump 20 is capable of generating the output voltage more quickly.

Figure 12:
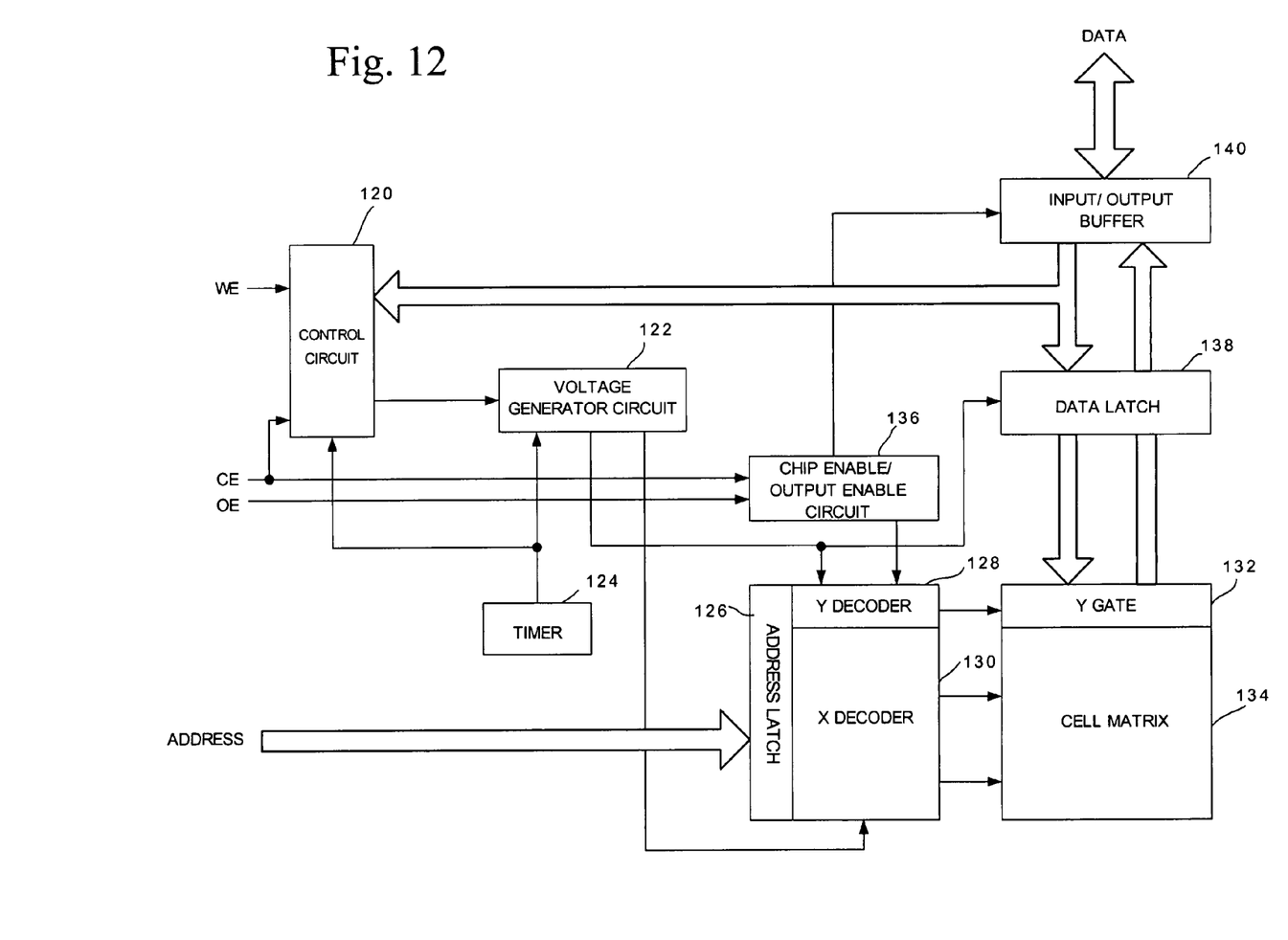
FIG. 12 is a block diagram of the entire structure of the non-volatile semiconductor memory of the present invention.

FIG. 12 is a block diagram of the entire structure of the flash memory. The flash memory is equipped with a control circuit 120, a voltage generator circuit 122, a timer 124, an address latch 126, a Y decoder 128, an X decoder 130, a Y gate 132, a cell matrix 134, a chip enable/output enable circuit 135, a data latch 138 and an input/output buffer 140.

The control circuit 120 has a built-in command register, and operates in synchronism with a chip enable signal CE and a write enable signal, which signals are externally supplied. The control circuit 120 generates timing signals based on commands supplied from the outside via the input/output buffer 140, and supplies these timing signals to associated inner parts. The control circuit 120 generates the control signals supplied to the booster 60 shown in FIG. 3 in response to a command input, and generates the signals shown in FIG. 10.

The voltage generator circuit 122 has a configuration that includes the first pump 10, the second pump 20, the read-exclusive booster 30, and the booster 60 shown in FIG. 3. The boosted voltages generated by the voltage generator 122 are applied to the associated parts via signal line shown in FIG. 12. The timer 124 generates the clocks and the timing signals Φ11, Φ12. Φ21 and Φ22.

The address latch 126 latches an address externally supplied, and supplies the latched address to the Y decoder 128 and the X decoder 130. The Y decoder 128 specifies an address in the Y direction indicated by the latched address (one bit line running in the cell matrix 134), and turns ON the associated transistor in the Y gate 132. The Y gate 132 has the respective transistor 40 for each bit line. At the time of programming, the gate of the selected transistor 40 in the Y gate 132 is supplied with VPROG or VPPI output by the voltage generator circuit 122, and the bit line is supplied with the voltage VPROG. The X decoder 130 specifies an address in the X direction indicated by the latched address, and drives the associated word line. The cell matrix 134 has a large number of memory cells in rows and columns, each being as shown in FIG. 2. The cell matrix 134 is a so-called a NOR-type array. The word line thus selected is supplied with the high voltage VPROG or VPPI generated by the voltage generator circuit 122.

The chip enable/output enable circuit 136 receives the chip enable signal CE and activates the Y decoder 128. The circuit 136 receives the output enable signal OE and activates the input/output buffer 140. Data read from the cell matrix 134 is output to the outside of the flash memory via the Y gate 132, the data latch 138 and the input/output buffer 140. Write data externally supplied is written into the selected memory cell in the cell matrix 134 via the input/output buffer 140, the data latch 138 and the Y gate 132.

The flash memory thus configured employs the aforementioned booster 60 and a reduced time for programming.

The present invention includes a semiconductor device having a non-volatile semiconductor memory. For instance, the present invention includes semiconductor devices such as the flash memory, and a systemized semiconductor device with the non-volatile semiconductor memory and a control circuit.

What is claimed is:

1. A non-volatile semiconductor memory comprising:
   a first pump starting to operate at a first timing and producing a first voltage;
   a second pump starting to operate at a second timing following the first timing and driving a given node at a second voltage, the given node being connected to a non-volatile semiconductor memory cell; and
   a booster boosting the given node using the first voltage at the second timing.

2. The non-volatile semiconductor memory as claimed in claim 1, wherein a period from the first timing to the second timing is provided for program verification and another period starting from the second timing is provided for programming.

3. The non-volatile semiconductor memory as claimed in claim 1, wherein the booster comprises:
   a capacitor;
   a first circuit that allows the first voltage to be applied to the given node during a period from the first timing to the second timing; and
   a second circuit applying a voltage based on the first voltage to the given node during only a predetermined period starting from the second timing.

4. The non-volatile semiconductor memory as claimed in claim 3, wherein the capacitor is also used for generating a read voltage applied to the gate of the non-volatile semiconductor memory at the time of reading data.

5. The non-volatile semiconductor memory as claimed in claim 1, wherein the second pump comprises a plurality of boost stages, and nodes between adjacent boost stages among the plurality of boost stages are precharged by the first voltage during a period from the first timing to the second timing.

6. The non-volatile semiconductor memory as claimed in claim 5, wherein the second pump circuit comprises transistors which apply the first voltage to the nodes in response to a signal indicating the period from the first timing to the second timing.

7. The non-volatile semiconductor memory as claimed in claim 1, wherein the first voltage is applied to a bit line to which the non-volatile semiconductor memory is connected at the time of programming.

8. A charge pump circuit comprising:
   a first pump starting to operate at a first timing and producing a first voltage; and
   a second pump starting to operate at a second timing following the first timing and driving a given node at a second voltage,
   the second pump including a plurality of boost stages, wherein nodes between adjacent boost stages among the plurality of boost stages are precharged by the first voltage during a period from the first timing to the second timing.

9. The charge pump circuit as claimed in claim 8, wherein the second pump circuit comprises transistors which apply the first voltage to the nodes in response to a signal indicating the period from the first timing to the second timing.

10. A semiconductor device comprising:
    a non-volatile semiconductor memory cell;
    a first pump starting to operate at a first timing and producing a first voltage; and
    a second pump starting to operate at a second timing following the first timing and driving a given node at a second voltage, the given node being connected to the non-volatile semiconductor memory cell,
    the second pump including a plurality of boost stages, wherein nodes between adjacent boost stages among the plurality of boost stages are precharged by the first voltage during a period from the first timing to the second timing.

11. The semiconductor device as claimed in claim 10, wherein the second charge pump includes a transistor that applies the first voltage to the given node in response to a signal indicating a period from the first timing to the second timing.

12. The semiconductor device as claimed in claim 10, wherein the first voltage is applied to a bit line to which the non-volatile semiconductor memory is connected at the time of programming.

13. A method comprising the steps of:
    starting up an operation of a first pump at a first timing to produce a first voltage;
    starting up an operation of a second pump at a second timing following the first timing to drive a given node at a second voltage, the given node being connected to a non-volatile semiconductor memory cell; and
    boosting the given node using the first voltage at the second timing.

14. A method comprising the steps of:
  starting up an operation of a first pump at a first timing to produce a first voltage;
  starting up an operation of a second pump at a second timing following the first timing to drive a given node at a second voltage, the given node being connected to a non-volatile semiconductor memory cell; and
  precharging nodes between adjacent boost stages among a plurality of boost stages of the second pump by the first voltage during a period from the first timing to the second timing.

* * * * *